(12) United States Patent
Favier et al.

(10) Patent No.: US 9,957,154 B2
(45) Date of Patent: May 1, 2018

(54) METHOD FOR MANUFACTURING A DEVICE COMPRISING A HERMETICALLY SEALED VACUUM HOUSING AND GETTER

(71) Applicant: ULIS, Veurey Voroize (FR)

(72) Inventors: Jérôme Favier, Saint Laurent du Pont (FR); David Bunel, Moirans (FR)

(73) Assignee: ULIS, Veurey Voroize (FR)

( * ) Notice: Subject to any disclaimer, the term of this patent is extended or adjusted under 35 U.S.C. 154(b) by 0 days. days.

(21) Appl. No.: 15/320,719

(22) PCT Filed: Jul. 7, 2015

(86) PCT No.: PCT/FR2015/051869
§ 371 (c)(1),
(2) Date: Dec. 20, 2016

(87) PCT Pub. No.: WO2016/009126
PCT Pub. Date: Jan. 21, 2016

(65) Prior Publication Data
US 2017/0137281 A1    May 18, 2017

(30) Foreign Application Priority Data

Jul. 18, 2014 (FR) .................................... 14 56961

(51) Int. Cl.
*H01L 23/00* (2006.01)
*H01L 31/18* (2006.01)
(Continued)

(52) U.S. Cl.
CPC ........ *B81B 7/0038* (2013.01); *B81C 1/00269* (2013.01); *B81C 1/00285* (2013.01);
(Continued)

(58) Field of Classification Search
CPC ... H01L 2224/48091; H01L 2224/4807; H01L 23/25; H01L 23/564; H01L 31/186;
(Continued)

(56) References Cited

U.S. PATENT DOCUMENTS

| 4,674,671 A | * | 6/1987 | Fister | ................... | B23K 20/007 |
| | | | | | 228/111 |
| 5,288,380 A | * | 2/1994 | Jackson, Jr. | .......... | C23C 14/083 |
| | | | | | 204/192.15 |

(Continued)

FOREIGN PATENT DOCUMENTS

| EP | 1640333 A1 | 3/2006 |
| EP | 2586741 A2 | 5/2013 |
| FR | 2874691 A1 | 3/2006 |

OTHER PUBLICATIONS

International Search Report and Written Opinion issued in PCT/FR2015/051869 dated Oct. 13, 2015.
(Continued)

*Primary Examiner* — Galina Yushina
(74) *Attorney, Agent, or Firm* — Marshall, Gerstein & Borun LLP

(57) ABSTRACT

A method of manufacturing a device having a microelectronic component housed in a hermetically sealed vacuum housing, including forming a getter in said housing, pumping out and heating the device to degas elements housed in said housing, after said pumping, hermetically sealing the housing in fluxless fashion.
Further, each material forming the device likely to degas into the inner space is a mineral material, the getter is capable of substantially trapping hydrogen only and is inert to oxygen and/or to nitrogen and the heating and the sealing are performed at a temperature lower than 300° C.

6 Claims, 2 Drawing Sheets

(51) Int. Cl.
 B81B 7/00 (2006.01)
 B81C 1/00 (2006.01)
 G01J 5/20 (2006.01)
(52) U.S. Cl.
 CPC .............. *G01J 5/20* (2013.01); *H01L 23/564* (2013.01); *H01L 31/186* (2013.01); *B81B 2201/0207* (2013.01); *B81C 2203/019* (2013.01); *B81C 2203/0145* (2013.01); *H01L 2224/48091* (2013.01)
(58) Field of Classification Search
 CPC ............... H01L 51/5259; B21B 7/0038; B81B 2201/0207; B81C 1/00269; B81C 1/00285; B81C 2203/019; B81C 2203/0145; B81C 2203/00; B81C 2203/0172; B81C 2203/031; B81C 2203/03
 See application file for complete search history.

(56) References Cited

U.S. PATENT DOCUMENTS

| | | | | |
|---|---|---|---|---|
| 2001/0010360 A1* | 8/2001 | Oda | ........................ | G01J 5/02 250/338.1 |
| 2001/0028032 A1* | 10/2001 | Church | ................. | G01N 21/31 250/227.14 |
| 2002/0084182 A1* | 7/2002 | Sasaki | ................. | C23C 14/0036 204/192.21 |
| 2002/0175284 A1 | 11/2002 | Vilain | | |
| 2003/0062610 A1* | 4/2003 | Kovacs | ................... | H01L 23/26 257/682 |
| 2003/0071215 A1* | 4/2003 | Ajisawa | ..................... | G01J 5/20 250/338.1 |
| 2004/0188496 A1* | 9/2004 | Liu | ...................... | B23K 3/0638 228/56.3 |
| 2006/0060785 A1* | 3/2006 | Tinnes | ..................... | G01J 5/02 250/338.1 |
| 2007/0015300 A1* | 1/2007 | Liu | ......................... | H01L 33/62 438/26 |
| 2012/0061572 A1* | 3/2012 | Hannebauer | ...... | H01L 27/14669 250/338.4 |
| 2012/0097415 A1* | 4/2012 | Reinert | ............. | H01L 27/14618 174/50 |
| 2013/0214400 A1 | 8/2013 | Shu et al. | | |
| 2016/0276563 A1* | 9/2016 | Kryskowski | ........... | H01L 35/32 |

OTHER PUBLICATIONS

Abstract of Mottin et al., "Uncooled amorphous silicon technology enhancement for 25-um-pixel pitch achievement," *SPIE 4820, Infrared Technology and Applications XXVII*, (Jan. 23, 2003).

Abstract of Benvenuti et al., "Vacuum properties of palladium thin film coatings," *Vacuum*, vol. 73, Issue 2 (Mar. 19, 2004).

* cited by examiner

METHOD FOR MANUFACTURING A DEVICE COMPRISING A HERMETICALLY SEALED VACUUM HOUSING AND GETTER

TECHNOLOGICAL FIELD

The present description relates to the field of the hermetic sealing of microelectronic components under high vacuum, for example, detectors based on microbolometers for infrared imaging or thermometry.

BACKGROUND

For certain applications, microelectronic components have to operate in vacuum to achieve the desired performances. This is true, in particular, for non-cooled detectors for infrared imaging based on bolometric microbridges, called "microbolometers" hereafter. In the field of so-called "thermal" infrared detectors, it is indeed known to use one-dimensional or two-dimensional arrays of elements sensitive to infrared radiation, capable of operating at ambient temperature.

A thermal infrared detector conventionally uses the variation of the electric resistivity of a thermometric material, or also known as "bolometric" according to its temperature. The unit sensitive elements of the detector, or "bolometers", are usually in the form of membranes, each comprising a layer of thermometric material, and suspended above a substrate, generally made of silicon, by support arms having a high thermal resistance. Such membranes, collectively called "retina", especially implement a function of absorption of the incident radiation, a function of conversion of the power of the absorbed radiation into thermal power, and a thermometric function of conversion of the generated thermal power into a variation of the resistivity of the thermometric material, such functions being implementable by one or a plurality of different elements. Further, the support arms of the membranes are also electrically conductive and connected to the thermometric layer thereof, and means for sequentially addressing and biasing the thermometric elements of the membranes and means for forming electric signals usable in video formats are usually formed in the substrate having the membranes suspended thereabove.

Such a detector is for example described in document: "Uncooled amorphous silicon technology enhancement for 25 µm pixel pitch achievement"; E. Mottin et al, Infrared Technology and Application XXVIII, SPIE, vol. 4820E.

To make thermal losses by gas convection, which would limit the quality of the detection, negligible, the sensitive retina is usually integrated in a hermetically sealed housing, or housing, under a very low pressure. The housing is provided with a window transparent to radiations of interest, usually having a wavelength between 8 and 14 micrometers. As a variation, each bolometer is integrated in a hermetically sealed micro-housing provided with such a window. The pressure level in the housing is typically adjusted so that losses by convection are smaller than losses by thermal conduction via the support arms, thus ensuring a fine detection. To achieve this, the gas pressure in the housing is thus usually lower than or equal to $10^{-2}$ mbar, and preferably lower than $10^{-4}$ mbar.

However, obtaining such a pressure level requires specific techniques for the hermetic sealing of the housing. Further, it can be observed that certain materials degas after the sealing into the inner space, or cavity, delimited by the housing. The maintaining of the initial low pressure level in the housing during the detector lifetime, typically 20 years, should thus be ensured despite the degassing of the surfaces and elements internal to the housing.

Referring to the example of FIG. 1, the vacuum sealing of a bolometric detection device usually uses the following sub-assemblies: a base 10 comprising a bottom 12 and lateral walls 14, formed in one piece, bolometric detector 16, usually formed of the sensitive retina integrated on the sense substrate, and a cap transparent to infrared radiation 18, or "window", playing at the same time a role of mechanical protection, of hermetic closing of base 10, and of transparency to infrared radiation. Finally, a getter 20 is also housed in the housing to maintain a sufficient vacuum level despite the degassing of the elements in communication with inner space 22 of housing 24 defined by base 10 and window 18.

Base 10 is usually formed of an assembly of mainly metallic or ceramic materials, and also forms the electric interface of the detector with the outside of the housing by means of connector elements 26. Component 16 is fixed to the bottom of the housing, for example, by gluing, and connected to connection areas 28 reserved for this purpose in housing 24 by a wiring 30 known per se in the state of the art.

Window 18 is assembled on base 10 directly or indirectly by means of an intermediate part, the assembly being formed by a fluxless soldering having operating conditions which limit the degassing of the sub-assemblies just described during the sealing of the window to the base. As known per se, the fluxless soldering requires the presence of non-oxidized metal layers on window 18 and base 10, at the level of surfaces intended for the hermetic junction of these parts. The metal layers are thus usually formed of one or a plurality of layers, at least the last one thereof being made of a noble metal such as gold, or more seldom platinum. Fluxless soldering, which enables to bond metal elements together by atomic diffusion by means of a mechanical action, or more currently by heating until the metal seal at least partially melts, is well known per se and will thus not be described in detail. As known per se, to obtain a good connection between metal elements, for example by welding or soldering, it is preferably for the elements not to be oxidized at their surface. To achieve this, either a deoxidizing material or flux is used, to remove the oxide layer, or the metal elements are non-oxidizable.

Getter 20 is usually made of materials having a strong affinity for the main gas molecules likely to be emitted (degassed) by all the internal surfaces of cavity 22 of the housing. The getter is in particular selected to adsorb $H_2$, $N_2$, $O_2$, $H_2O$, and volatile carbon compounds (called organic) such as, for example, $CH_4$. Typical materials used for the getter are, as well known, alloys based on elements Zr, Ti, Co, Fe, or Ba. Getter 20 usually appears either in the form of sintered blocks fixed to the inside of cavity 22, or in the form of one or of a plurality of thin layers deposited on strips, plates, or mineral substrates by means of evaporation or of cathode sputtering techniques, integrated in cavity 22 on assembly of component 16 in housing 24.

As known per se, a getter used in this type of application requires being activated to be able to adsorb the previously-indicated gases, the activation comprising making the getter surface reactive by means of an adapted thermal cycle carried out in vacuum. A getter 20 in the form of thin films, having a thickness in the range from one to a few micrometers generally requires a thermal activation at a much lower temperature than a sintered getter. Thus, known thin-film getters can be activated by simple heating of the device just described at a temperature in the range from 350° C. to 400° C. once the housing has been sealed.

Sintered getters require a temperature in the order of 800° C. or more, so that a general heating of the tight housing at this temperature would cause irreparable damage. The activation of a sintered getter is thus performed by Joule effect by means of electric connections provided for this purpose, which enables to substantially only heat the getter. The activation of such a getter however induces an intense radiation capable of damaging the bolometers. Further, a thin-film getter is usually preferred since it requires no electric connection accessible from the outside of the housing. This character simplifies the architecture, and thus the manufacturing process, and thus decreases the cost of the housing. Indeed, the connections crossing the base of the housing may raise tightness problems and induce significant design constraints due to the high intensities to be applied during the activation to generate the necessary high temperatures.

However, a thin-film getter is a constraint for the general device manufacturing method, since the getter efficiency is all the better as the activation temperature is high, even though it remains within a lower range, as specified. Actually, this specific thermal activation step, generally formed on the entire device, always defines the maximum temperature point to which the electronic component is submitted during its manufacturing cycle. In other words, the complete design of the component, and generally all the portions of the device, are actually directly dependent on the characteristics of the thin-film getter used.

SUMMARY OF THE DESCRIPTION

The presently described embodiments aim at solving the above-mentioned problem of excessive heating by providing a method of manufacturing a device comprising a microelectronic component housed in a hermetic housing where a low pressure is maintained by means of a getter which requires no constraining thermal treatment.

To achieve this, the described embodiments aim at a method of manufacturing a device comprising a microelectronic component housed in a housing formed of walls delimiting a hermetically sealed vacuum inner space, comprising:

forming a getter in the form of thin films capable of trapping gas in said inner space;

pumping from said inner space;

during said pumping, heating the device to degas the elements housed in said inner space; and after said pumping, hermetically sealing the housing in fluxless fashion.

According to the embodiments:

each constituent of the device likely to degas into the inner space is a mineral material;

the getter is capable of substantially trapping hydrogen only and is inert to oxygen and/or nitrogen; and the heating of the device and the sealing of the housing are carried out at a temperature lower than 300° C., particularly a temperature in the range from 100° C. to 200° C.

"Thin film" means an element formed of one or a plurality of layers having a total thickness smaller than 2 micrometers, each layer thereof preferably having a thickness in the range from 0.1 to 1 micrometer.

"Mineral" material means a metallic, ceramic, or inorganic semiconductor material or any combination, assembly, alloy, dispersion of said materials between one another, preferably in a non-porous form. In this context, all materials pertaining to organic chemistry, that is, based on carbon, are considered as non-mineral, except, specifically, for pure or alloyed carbon forms, combined or not, dispersed or not with or in another mineral material. In particular, carbon polymers containing or not organic solvents contained in adhesives are considered as non-mineral materials.

In other words, it is usually considered that in the case of sealed high-vacuum components, the gases which should be adsorbed by the getter during the life cycle of the components mainly are nitrogen, hydrogen, water vapor, and by a lesser extend carbon compounds, particularly $CO$, $CO_2$, and $CH_4$. The presence of such gases considered automatic by a variable quantity requires using getters sufficiently reactive to all of them. This is why getter materials are usually made of or contain zirconium or titanium, the latter being capable of trapping a large variety of gases.

Now, such metals are naturally "passivated" at their surface, that is, covered with a little permeable and/or little reactive layer, particularly an oxide or nitride layer. Such a passivation with oxygen or nitrogen is in practice inevitable after the forming of the getter, due to its separate manufacturing prior to the final integration in the housing. As a result, an in situ reactivation of the getter surface is necessary to remove the surface layer and thus make the getter active, the activation being obtained in high vacuum and at temperatures greater than 300° C.

However, the inventors have observed that the partial pressures in the hermetically sealed housing of the gases other than hydrogen can be controlled during the sealing and during the device lifetime due to specific design and assembly techniques and precautions. In practice, mineral materials generally have a sufficiently low degassing rate for gases other than hydrogen, after heating in high vacuum, to be neglected in the pressure ranges considered.

More particularly, the sum of the partial pressures except for hydrogen obtained by the inventors, and this, reproducibly on a plurality of devices, in sealed high vacuum housings is in the order of $10^{-5}$ mbar and only negligibly varies along time after the sealing of the housing. However, the inventors have noted that the partial pressure of hydrogen is highly fluctuating and capable of varying along time once the housing has been tightly sealed. The inventors have thus observed that, conversely to the state of the art of vacuum sealing of housings, the use of a getter which is only reactive to hydrogen enables to reach the required pressure level and stability, typically in the order of $10^{-4}$ mbar, by taking particularly simple specific precautions.

These specific precautions especially comprise only using, for all surfaces in relation with the cavity, materials which substantially degas no gas other than, possibly, hydrogen once the housing has been sealed, and implementing a step of degassing by moderate heating of the device before sealing the housing to free the internal surfaces of the cavity from possibly contaminations such as $O_2$, $H_2O$, $N_2$, Ar and most molecules of organic nature or origin, that is, containing carbon chemically linked to hydrogen, nitrogen, oxygen, for example $CO$, $CO_2$, hydrocarbons (e.g.: $CH_4$), or a halogen such as fluorine or chlorine, for example. Typically, all the materials likely to degas into the internal cavity are mineral materials, preferably non porous, and if they comprise carbon, the latter is in one or a plurality of its solid forms.

Thereby, a very low quantity of atmospheric and organic gases is ensured in the tight housing and the main source of instability of the pressure therein is inhibited by a getter for hydrogen only. Now, the inventors have also observed that having less constraints as to the type of gas to be trapped makes it possible to use getter materials which do not passivate at their surface, in other words, which do not form an oxide and/or nitride layer at their surface, particularly palladium. The absence of passivation by oxygen and/or nitrogen (e.g. the gaseous oxygen and nitrogen present in the atmosphere), particularly in the pressure and temperature conditions encountered during the housing manufacturing (specifically, a pressure in the range from $10^{-5}$ bars to 1.5 bar and a temperature in the range from 0° C. to 300° C.) avoids the need for an activation by heating. Since the device no longer needs being submitted to temperatures higher than 300° C., its most sensitive elements, particularly the microelectronic component and its bolometric retina, are much less likely to have their properties degraded by heat, which is a key point for the use of fragile or/and thermally unstable structures or materials.

The fluxless sealing may for example be carried out by means of a fluxless soldering, of an anodic bonding, of a bonding by metal diffusion, or of a molecular bonding.

According to an embodiment:

the forming of the hermetically sealed housing comprises forming lower walls and an upper cap (in particular a window transparent to infrared radiation in the context of an infrared detector);

the forming of a getter comprises forming a metallic hydrogen getter material layer on the cap;

the placing of the cap on the lower walls with a first portion only of said getter layer resting on the lower walls;

the forming of the getter with at least a second portion of said getter layer which does not rest on the lower walls; and the application of a mechanical contact action, that is, a compression and/or friction effort between the lower walls and the cap, and/or a heating of said first portion of the getter layer to form with no flux input a hermetic metallic seal, that is, the sealing, to be performed with no flux, between the cap and the lower walls.

More particularly, the first portion and the second portion of said getter layer form a single continuous pattern, or a plurality of discontinuous patterns, that is, in at least two separate portions. In other words, these at least two portions are adjacent or separate.

In other words, the hydrogen getter is formed or comprises a metal layer deposited on at least one of the walls of the hermetically sealed housing and at least partially exposed to the inner atmosphere of the housing. More particularly, this layer is formed on the housing window. As a variation, the cap comprises walls bearing on a substrate, typically the substrate having the microelectronic component formed thereon, the cap having a U-shaped cross-section, for example, and the metal layer is formed on the substrate. This layer advantageously comprises two portions formed in a single operation, a first portion being integrated in the assembly junction of fluxless soldering of the housing, and a second portion being in direct interaction with the inside of the housing and accordingly forming part of the getter. The soldering method is implemented in fluxless fashion on forming of the assembly to avoid the presence in the cavity, even in the state of traces, of one or a plurality of components of the solder flux which would not enable to reach the targeted vacuum level. This layer may advantageously be used as a fluxless soldering interface material to seal the housing. Thus, the forming of a portion at least of the hydrogen getter necessary to the quality of the final vacuum, and of a portion at least of the hermetic assembly seal by means of a single manufacturing step enables to simplify the design of the device and to limit the manufacturing cost thereof, particularly the manufacturing cost of the window. More particularly, according to the state of the art, the metallization of the windows with noble metals for the fluxless soldering on the one hand, and the getter function on the other hand, are obtained independently by means of separate layers due, in particular, to the different materials used. The embodiment decreases the number of manufacturing steps, which decreases the manufacturing cost.

According to an embodiment, the getter comprises a hydrogen trapping material made of palladium or of platinum, or of a mixture or of an alloy thereof. The palladium or the platinum enable to simultaneously form a hydrogen getter, and a surface insensitive to passivation, particularly by oxygen and by nitrogen, capable of implementing a fluxless soldering.

According to an embodiment, the getter comprises a palladium or platinum layer having a thickness in the range from 100 nanometers to 1 micrometer.

According to an embodiment, the gas pressure in the inner space is lower than $10^{-4}$ mbar, and the electronic component is a bolometric detector.

The described embodiments also aim at the use of a getter substantially only trapping hydrogen to maintain a pressure level in a hermetically sealed housing having an electronic component housed therein. Advantageously, the getter comprises palladium or platinum to trap hydrogen.

The described embodiments also aim at a device comprising:

a hermetically sealed vacuum housing formed of walls delimiting an inner space;

a microelectronic component housed in the housing; and a getter housed in the inner space, wherein each constituent of the device likely to degas into the inner space is a mineral material and wherein the getter only traps hydrogen and advantageously comprises palladium or platinum to trap hydrogen.

According to an embodiment, the housing comprises a window hermetically sealed onto a base by means of a metallic sealing layer, and the getter comprises a metallic getter material layer, in a layout where the sealing layer and the getter material layer are formed of one and the same metallic material layer. In particular, the metallic sealing layer and the metallic getter layer are adjacent.

BRIEF DESCRIPTION OF THE DRAWINGS

The presently described embodiments will be better understood on reading of the following description provided as an example only in relation with the accompanying drawings, where the same reference numerals designate the same or similar elements, among which.

DETAILED DESCRIPTION

Figure 1:
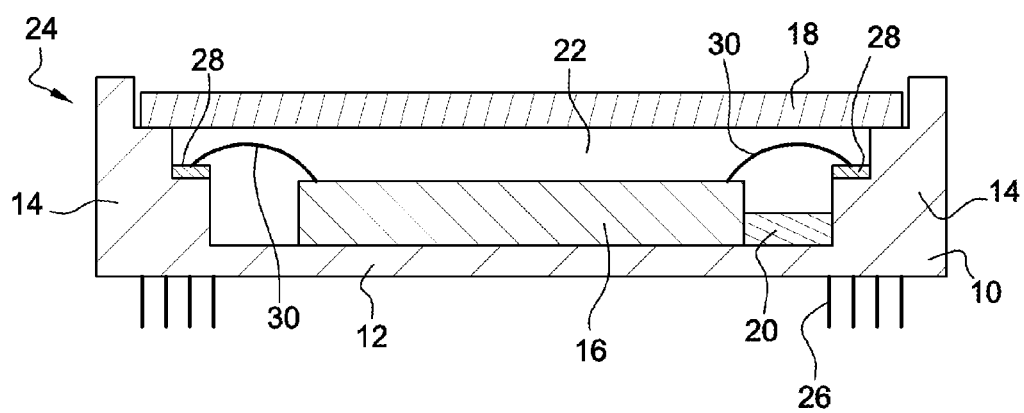
FIG. 1 is a simplified cross-section view of a bolometric detection device of the state of the art, already described hereabove.

In the following, examples of methods of manufacturing a hermetically sealed housing comprising a microelectronic component and a hydrogen getter are described. These examples are based on methods well known in the state of the art, modified to implement the contemplated embodiments.

A) First Embodiment: Sealing of the Housing with a Pumping Out of the Housing Via an Exhaust Tube According to a method of the state of the art, the hermetically sealed housings closed by a window transparent to radiations of interest, usually made of silicon or of germanium for infrared applications, are pumped out via a tube crossing a wall of the housing, called "exhaust tube", enabling to pump from the inner space of the housing. The housing is typically made of metallic materials or associating a metal for the walls, the bottom, and the cap, and glass and/or ceramic for the electrical paths formed in the walls, thus forming a hermetically closed enclosure once the exhaust tube has been mechanically sealed. More particularly, the window is placed on the lateral walls of the housing and attached thereto by soldering. A layer of metallic solder material is deposited for this purpose on the window and/or the lateral walls of the housing, after which a thermal and/or mechanical action is exerted to obtain the atomic diffusion/migration and/or the at least partial melting of the solder material and thus obtain the hermetic joint of the window and of the lateral walls.

To achieve the desired vacuum level, the assembly is then heated up to temperatures in the range from 100° C. to 200° C. to degas the inner surfaces of the housing while carrying out a dynamic pumping of said space through the exhaust tube. The pumping step usually lasts for from several hours to a few days according to the desired vacuum level, to the housing dimensions, and to the exhaust tube, to the presence in the housing of filled elements or various gas sources, for examples, compounds of organic nature, such as adhesives or polymers. At the end of the pumping step, the exhaust tube, usually made of copper, is crushed and cut by means of a hydraulic clamp. This step is commonly called "pinch off". The activation of the getter arranged inside of the sealed housing is performed subsequently during an additional step. According to this state of the art, the getter usually is a sintered getter which requires an activation at high temperature, typically at least 800° C., electrically by Joule effect to only heat the getter itself.

The sintered getter is replaced with a getter for hydrogen only which requires no activation, deposited on one of the components of the hermetically sealed enclosure, for example, on the base, one of the lateral walls of the housing, or on the window surface, in relation with the inner space, or also on a portion of the window which does not disturb the detection of a bolometric retina arranged in the housing. The getter comprises as a getter material a layer of noble metal capable of absorbing hydrogen by physisorption, of a thickness in the range from 100 nanometers to 1 micrometer. This layer is for example deposited on a metal strip, or "getter strip", previously spot soldered or welded on a metallized area inside of the housing according to known techniques. There is no need to protect the portion intended for the soldered or welded assembly of the getter strip on deposition of the getter material on the strip, since the latter does not passivate once it has been deposited. The strip manufacturing sequence is thus simplified and less expensive.

Advantageously, the hydrogen getter material is also selected to have qualities necessary to subsequently implement a fluxless soldering, which is especially true for palladium, which is a noble metal. Thereby, the material is also used to seal the window, which enables to decrease the number of manufacturing steps. More particularly, the layer of solder material and the layer of hydrogen getter material are formed on the window, outside of the reserved optical transparency area, in one and the same deposition step, where the thickness of the layer for the soldering may or not be different from the thickness of the layer for the getter. Said deposition thus comprises according to this variation:

a first portion, preferably at the very end of the window, intended for the fluxless soldering of said window on said lateral walls of the housing, with, possibly an intermediate support if necessary as known; and a second portion adjacent or separate from the second portion, preferably at the inner periphery of the window, which will remain in direct relation with the inner space of the housing once the window has been sealed, and intended to play the role of a getter.

Advantageously, a stack of at least two layers is formed to increase the mechanical resistance of the getter and/of the solder material. The deposition particularly comprises depositing at least a first bonding layer having the function of improving the mechanical cohesion between said metal stack and the surface having the stack formed thereon, and depositing at least a second layer forming the hydrogen getter material. Thus, on said surface, which corresponds to the getter strip or the window according to the previously-discussed modes, a first titanium or chromium bonding layer is deposited, after which a second layer of getter/solder material is deposited on the bonding layer. The thicknesses of the deposited materials are in the range from 30 nm to 300 nm for the bonding layer (typically titanium or chromium) and from 100 nm to 1 μm for the getter/solder material (particularly palladium or platinum).

Figure 2:
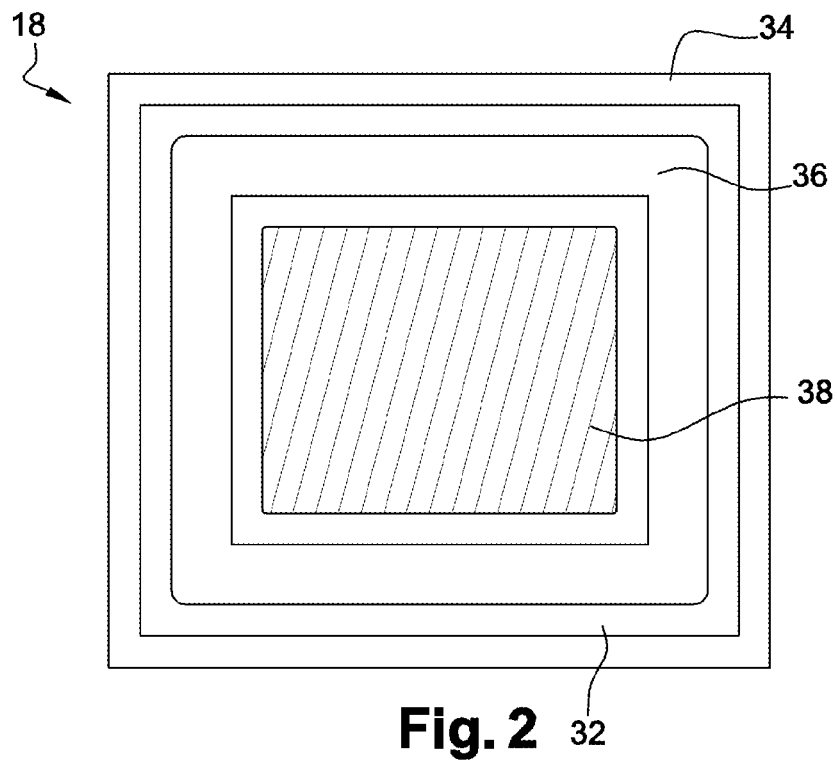
FIG. 2 is a simplified view of the opposite surface of the inner space of a bolometric detector housing window.

Referring to the view of the opposite surface of the internal cavity of the window of FIG. 2, surface 32 of window 18 placed on the inner walls of the housing comprises a metallization area 34 formed on the edge of the window, that is, the window portion installed and sealed on the lateral walls of the housing, and a hydrogen getter area 36 formed outside of said portion, for example, in the form of a strip, areas 34 and 36 being deposited during a same deposition step on surface 32. This deposition may advantageously, but not necessarily, be implemented during the collective manufacturing of a plurality of windows, that is, before the "singulation" or cutting, into unit elements from a window substrate of larger surface area, typically of standard microelectronic format (disks having a 100-, 150-, 200-mm or larger diameter). Advantageously, central portion 38 intended to transmit the infrared radiation to the detection elements internal to the housing is protected by masking during the deposition of metal areas 34, 36. Advantageously, to avoid operations of etching of the metal stack, the various portions of this layer are defined together for example according to the so-called "lift-off" or "shadow mask" technique.

Thereby, the components assembled in this way have the required characters of initial quality and stability of the vacuum after the conventional step of pumping—degassing through the exhaust tube, such as previously described.

Preferably, the getter/soldering material is palladium. This noble metal indeed has:

the chemical characteristics of absorption by physisorption of hydrogen. This metal can indeed absorb a large quantity of hydrogen, as shown in document *Vacuum properties of palladium thin film coatings*, C. Benvenuti et al., Vacuum 73 (2004) 139-144]; and the chemical characteristics adequate for a fluxless soldering, since it is a metal non-oxidizable and non-nitridable in contact with the atmosphere, in other words, which does not passivate in contact with the oxygen and the nitrogen present in the atmosphere.

The hydrogen getter provided in the described embodiments has the specific property of requiring no activation, since palladium does not passivate by surface oxidation or nitriding when it is exposed to the atmosphere. The pumping of the hydrogen by physisorption is active at any moment and reversible. The step of degassing in vacuum before the pinch-off further enables to degas the hydrogen captured by this metal during its stay in the atmosphere. Thus, the method is efficient to maintain a low hydrogen pressure in a vacuum housing without requiring a high-temperature thermal activation or electric activation characteristic of currently-used getters.

To obtain the required vacuum level lower than $10^{-2}$ mbar, and preferably lower than $10^{-4}$ mbar, the cavity formed by the housing contains no component of organic nature or origin, for example, polymers or adhesives, which always and very durably degas large quantities, with respect to the required vacuum level, of water vapor and of volatile carbon compounds. The electronic component or chip housed in the housing, that is, the integrated circuit supporting the sensitive detection structures and these very structures, for example, microbolometric, is advantageously fixed by fluxless soldering by means of metals. The preferred constituents of all the elements likely to degas into the housing are thus inorganic, particularly of mineral nature, preferably non-porous, such as typically and in known fashion, and without this being a limitation, mineral semiconductors (Si, Ge, etc.), metals, dense ceramics such as alumina ($Al_2O_3$) or aluminum nitride (AlN), or also the various forms of carbon, pure or chemically combined, for example, in the form of carbides, as well as all associations, assemblies, alloys, dispersions of these materials between one another by any proportions.

B) Second Embodiment: Sealing of the Housing with a Pumping Out of the Housing According to a Method of Collective Sealing of Individual Parts Another state of the art relative to the hermetic sealing of microelectronic components, in particular, of microbolometric imaging components, provides a collective sealing which does not use exhaust tubes to obtain vacuum in the cavity of a housing. According, for example, to document FR 2874691, it is possible to collectively assemble discrete components in a vacuum oven taken to a sufficient temperature for a duration adapted to the desired vacuum level.

As in the case of housings pumped out by an exhaust tube, the vacuum cavities contain substantially no organic material (polymers, adhesives) which excessively degas, for too long a time for the implementation of the described embodiments.

The microelectronic component is particularly fixed by fluxless soldering in the housing opposite the window transparent to infrared radiation. The preferred constituents in the context of a collective sealing are similar to those in the previously-described embodiment, in terms of getter and/or of sealing of the window by soldering. Particularly, the getter is deposited in a thin film on a wall of the cavity. The housing used requires no specific technology other than those of the state of the art for the sealing of a hermetically sealed housing in so-called high vacuum.

Typically, the housing will thus be metallic or ceramic and comprises metallized areas for receiving the soldering, by installing of the electronic component and then of the window, covered with a layer of noble metal such as gold, to allow the implementation of a fluxless soldering to assemble the component and then the window.

The component comprises on the surface fixed to the housing a layer of noble metal which is soldered in fluxless fashion inside of the housing according to a thermal cycle preferably separated from the housing degassing and sealing cycle, which especially enables to form before the sealing the wire connections between the component and the electric vias of the housing.

The solder material used for the assemblies is preferably introduced in the form of a metal preform, having a composition defined by the desired melting temperature, and a geometric shape adapted to the needs of the assembly. Thus, for example, the component may be fixed to the housing by means of a conventional soldering of Au 80 wt. %-Sn 20 wt. % type, having a 280° C. melting temperature compatible with the selection of a second conventional preform of SAC 305 type (tin-silver-copper alloy) fusible at approximately 240° C. for the soldering of the seal between the window and the base of the housing. The thickness of these preforms is further selected to be sufficient to compensate for surface unevennesses of the sub-assemblies placed opposite each other. A preform thickness between 20 and 150 μm is in particular selected for this purpose.

The window used typically has a manufacturing identical to that provided in the context of the first embodiment with an exhaust tube, that is, individually, but advantageously collectively manufactured, from substrates of large formats cut into individual windows after the forming of the local optical treatment functions on the surfaces intended to be transparent to radiation, and of the getter on at least part of the surfaces intended to remain opaque.

The degassing and the sealing are then performed in the same high vacuum thermal cycle to reach the final pressure required in the component. The different elements of the housing, and particularly the window, are preferably previously degassed prior to the sealing of the window in a high vacuum oven, for example, according to the methods described in document FR 0409055. However, it is here not useful to degas/activate the element which supports the getter at the temperature normally required by usual getters since there is no need for an activation of the hydrogen getter made of a material insensitive to passivation.

An alternative embodiment in the case of collectively sealed housings is to use a getter element in the form of a getter strip such as previously described. This strip is also manufactured by depositing a layer of hydrogen getter material, particularly a palladium layer on a mineral support (typically made of metal or ceramic), and the strip is integrated by fluxless soldering in the hermetically sealed enclosure either before, for example, concurrently to the steps of fixing the microelectronic component, or during the cycle of final sealing of the window to the housing walls. In this case, the window may be a window according to the state of the art, or a window on which the getter material also plays the role of a solder interface material as previously described.

C) Third Example: Collective Sealing According to the so-Called "Wafer Level Packaging" Approach The presently described embodiments also apply to the sealing of components, particularly bolometric, at the substrate scale according to the so-called "wafer level packaging" technique.

Figure 3:
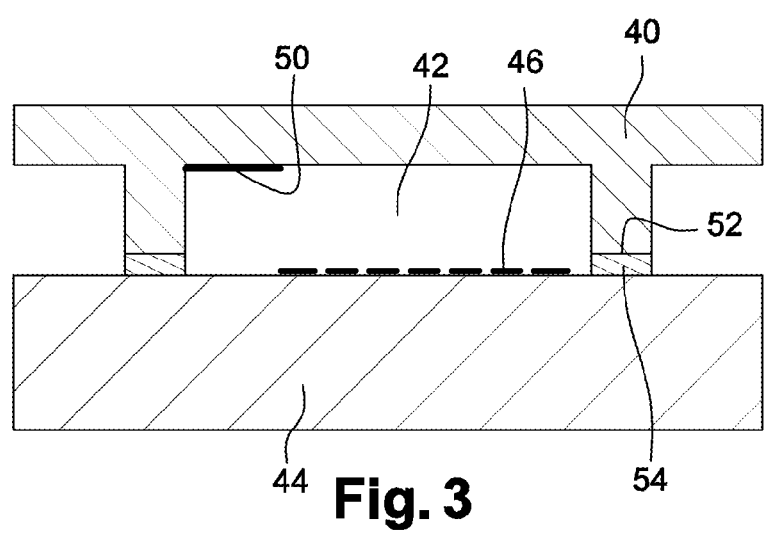
FIG. 3 is a simplified cross-section view of a device comprising a component encapsulated in a micro-housing.

According to the state of the art, illustrated as a reference with the simplified cross-section view of FIG. 3, a first transparent substrate 40, called "window wafer" or "cap wafer", on which cavities 42 have been formed, is assembled, by soldering, thermocompression, or vacuum melting, with a second substrate 44, called "chip wafer", which supports a plurality of microelectronic chips 46, each for example comprising at its surface a sensitive retina, each cavity 42 covering one of chips 46. These collectively-formed components also comprise in each cavity 42 a getter 50 to obtain a high vacuum in order to ensure their maximum performance.

The nature of the solder interface ensuring the tightness of the assembly of the "wafer level packaging"-type components is generally different from that of individually-formed components: the surface conditions and the surface evennesses of the cap wafers and of the chip wafers indeed enable to significantly decrease the quantities of solder used as compared with assemblies individually formed on separate housings.

Thus, the small required solder thicknesses enables to deposit the metal solder layers directly on the cap wafer or/and on the chip wafer. The deposition method is generally electrolytic and/or physical, for example by cathode sputtering or evaporation. To form the solder metallizations, a technique is to first deposit by physical processes (sputtering or evaporation), in very thin layers, a seed layer 52 on the surfaces reserved to the sealing interface, formed of a bonding layer and of a layer of noble metal. The noble metal enables to avoid the passivation in air of the metal surfaces, to ensure the quality of the interfaces and of the coverage of the exposed surfaces in a second step of electrolytic growth, intended for the local selective deposition on the exposed surfaces, of the actual solder material 54 by a larger thickness. The selective deposition enables to limit the consumption of precious metals such as gold, which is a usual component of the solder material.

Usually, the bonding layer is made of titanium or of chromium and has a thickness in the range from 30 nm to 300 nm, and the layer of solder material, for example, made of gold, has a thickness in the range from 100 nm to 500 nm. These layers are defined either by etching, or by masking by means of a "lift-off" or "shadow mask" technique. The electrolytic layer is for example made of gold by a thickness in the range from 1 micrometer to 5 micrometers, and then of tin by a thickness in the range from 1 to 5 micrometers. During the sealing process by vacuum thermocompression, gold and tin diffuse into each other and then partially melt to form an at least partly eutectic alloy.

In the context of the described embodiments, the gold of the seed layer on at least one of the substrates (cap wafer or chip wafer) is replaced with palladium, which is deposited over a larger surface area of a first substrate to form two adjacent or separate areas. The first area is intended to form or interface the solder joint opposite the metallization of the second substrate, and the second opposite area inside of each cavity, which remains exposed after the sealing, that is, in direct interaction with the atmosphere of the cavity, it intended to form getter 50.

The tight sealing is of course carried out as described in relation with the previous embodiments, that is, by implementing a pumping for the degassing, followed by a fluxless sealing, particularly a degassing and a sealing carried out in the same thermal cycle in high vacuum to reach the final pressure required in the component.

In the case where it is preferred to form the solder layers on the substrate which also supports the getter, to avoid the electrolytic deposition of the solder layers on the second areas, the latter are preferably masked before the electrolysis operation by a resist defined by photolithography. Thus, the area which is not covered with the electrodeposit is used as a hydrogen getter in the assembly, without it being necessary to introduce this getter function by means of specific additional steps necessary according to the state of the art. A substantial economy in terms of time, means, and costs is thus achieved.

D) Fourth Example: Monolithic Sealing on Wafer According to the Micro-Encapsulation Technique or "Pixel Level Packaging"

In the context of the hermetic sealing known as "Pixel Level Packaging" or "microcapping", each pixel or pixel group of a bolometric retina is encapsulated in an individual hermetic housing (or "microcapsule"), the housings being collectively formed by means of monolithic layers obtained by direct deposition of microelectronic type on a chip substrate. The detail of various embodiments is for example provided by document U.S. Pat. No. 6,753,526. According to this state of the art, to reach and maintain the required vacuum level, a thin-film getter is formed by a local deposition of titanium in each tight cavity thus defined. In the case of the use of a getter as described hereabove, the solvents, resins, and various aggressive processes, particularly oxidizing, used during the technological assembly of the sensitive microstructures and their cavities, alter the getter surface, or even at least partially inhibit its gaseous molecule trapping properties. This potentially results in the need, after sealing of the microcapsules, for a thermal activation at relatively high temperature to regenerate its properties.

In the context of the described embodiments, this getter is substituted with a hydrogen getter, preferably formed of at least two layers:

on the one hand, a bonding layer, having the function of achieving the mechanical cohesion between the material of the hydrogen getter and the substrate having the getter formed thereon, and on the other hand, a layer of noble metal, capable of absorbing hydrogen by physisorption, particularly a palladium layer.

The tight sealing is of course carried out as described in relation with the previous embodiments, that is, by implementing a pumping for the degassing, followed by a fluxless sealing, particularly a degassing and a sealing carried out in the same thermal cycle in high vacuum to reach the final pressure required in the component.

Apart from these properties of insensitivity to a passivation by the atmosphere, the advantage of the noble metal is that it resists conventional solvents and resins used to construct the microstructures and their cavities with no alteration of its surface. This metal thus requires no specific activation and operates as in the previous embodiments.

The presently described embodiments thus have several advantages.

The described embodiments enable to deposit the hydrogen getter and the metallization for the fluxless soldering during the same step, which enables to save the cost and the time of a complete getter deposition and structuring process. The cost gain provided is thus very substantial.

Further, getters based on titanium or based on zirconium currently used for sealing under secondary vacuum require heating the components up to temperatures necessarily beyond 300° C., or even more efficiently at least up to 350°

C. The thermal budget or range undergone by the microelectronic components at such temperatures may affect the physical characteristics of the most sensitive components integrated in the housing (typically, the microbolometers in the followed example) and thus the performances thereof, or even the functionalities thereof. The assembly method as well as the getter provided enable to seal delicate components at temperatures lower than those imposed by the state of the art, due to the fact that the maximum temperature is imposed by the melting temperature of the alloy used for the fluxless soldering, and not by the necessary activation of the getter. Now, for conventional alloys compatible with fluxless solderings, the housing sealing temperature range, generally from 150° C. (indium-rich alloys) to 250° C. (tin-rich alloys), is much lower than conventional getter activation temperatures. The maximum temperature applied to fragile components is thus significantly decreased, which results in a greater freedom of use of sensitive structures less resistant than required by the state of the art, while the normal use of the component after manufacturing requires by no means such a high resistance level. It thus becomes possible to produce sensitive structures with no other complications.

Palladium, which is preferably provided due to its accessible cost and its advantageous characteristics, may possibly be replaced with platinum (more expensive), as previously discussed.

The window soldering temperature is limited by the selection of the metal solder alloy, and no longer by the getter activation temperature, as for assemblies generally used in the state of the art. In practice, solders having melting temperatures in the range from 156° C. (pure indium) to 280° C. (Au 80-Sn 20) will be preferred according to the characteristics desired for the assembly.

Embodiments where a fluxless soldering is implemented to seal the window onto the base of the housing have been described. As a variation, an anodic bonding, a bonding by metal diffusion, or a molecular bonding is implemented to seal the housing, a portion of the layer forming the getter taking part or not in the fluxless sealing.

Similarly, a getter has been described in the form of a thin metal layer, e.g. having a thickness smaller than one micrometer, this embodiment being in particular preferred when said layer is used for the sealing of the housing. As a variation, the getter may comprise a layer of hydrogen getter material of larger thickness, whether a portion of this layer forming the getter takes part or not in the fluxless sealing. For example, the layer of getter material may have a thickness of a few micrometers.

Similarly, a preferred application to bolometric detector encapsulation for infrared detection, e.g. in the LWIR range, has been described. The described embodiments of course apply to any type of microelectronic component requiring such an encapsulation, particularly a micro-electromechanical system (MEMS) or a micro-opto electro-mechanical system (MOEMS).

The invention claimed is:

1. A method of manufacturing a device comprising a microelectronic component housed in a housing formed of walls defining a hermetically sealed vacuum inner space, comprising:
    forming a getter in a form of thin films capable of trapping gas in said inner space;
    pumping from said inner space;
    during said pumping, heating the device to degas the elements housed in said inner space; and
    after said pumping, hermetically sealing the housing in fluxless fashion;
    wherein each constituent of the device likely to degas into the inner space is a mineral material;
    wherein the getter is capable of substantially trapping hydrogen only and is inert to oxygen and/or nitrogen; and
    wherein the heating of the device and the sealing of the housing are carried out at a temperature lower than 300° C.

2. The method of claim 1:
    wherein the forming of the housing comprises forming lower walls and an upper cap;
    wherein the forming of the getter comprises forming a metal layer of hydrogen getter material on the cap;
    wherein the placing of the cap on the lower walls with a first portion only of said metallic getter material layer resting on the lower walls;
    wherein the forming of the getter with at least a second portion of said getter layer which does not rest on the lower walls; and
    wherein the application of a mechanical action on and/or a heating of said first portion of the metallic getter material layer to form a hermetic metal seal between the cap and the lower walls.

3. The method of claim 2, wherein the first portion and the at least one second portion of said metallic getter material layer are adjacent or separate.

4. The method of claim 1, wherein the getter comprises a hydrogen getter material made of palladium or of platinum.

5. The method of claim 4, wherein the getter comprises a palladium or platinum layer having a thickness in the range from 100 nanometers to 1 micrometer.

6. The method of claim 1, wherein the gas pressure in the inner space is smaller than 10-4 mbar, and wherein the electronic component is a bolometric detector.

* * * * *